(12) United States Patent
Choi et al.

(10) Patent No.: US 12,066,496 B2
(45) Date of Patent: Aug. 20, 2024

(54) SECONDARY BATTERY DIAGNOSING APPARATUS AND METHOD

(71) Applicant: LG Energy Solution, Ltd., Seoul (KR)

(72) Inventors: Soon-Ju Choi, Daejeon (KR); Dae-Soo Kim, Daejeon (KR); Young-Deok Kim, Daejeon (KR); Su-Won Jee, Daejeon (KR); Hyun-Jun Choi, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 5 days.

(21) Appl. No.: 17/918,730

(22) PCT Filed: Dec. 3, 2021

(86) PCT No.: PCT/KR2021/018292
§ 371 (c)(1),
(2) Date: Oct. 13, 2022

(87) PCT Pub. No.: WO2022/145776
PCT Pub. Date: Jul. 7, 2022

(65) Prior Publication Data
US 2023/0236262 A1    Jul. 27, 2023

(30) Foreign Application Priority Data
Dec. 28, 2020    (KR) .................. 10-2020-0184944

(51) Int. Cl.
*G01R 31/396*    (2019.01)
*G01R 31/367*    (2019.01)
*H01M 10/44*    (2006.01)

(52) U.S. Cl.
CPC ......... *G01R 31/396* (2019.01); *G01R 31/367* (2019.01); *H01M 10/44* (2013.01); *H01M 2220/20* (2013.01)

(58) Field of Classification Search
CPC ... G01R 31/396; G01R 31/367; H01M 10/44; H01M 2220/40
(Continued)

(56) References Cited

U.S. PATENT DOCUMENTS 10,459,038 B2    10/2019    Becker et al.
2012/0059526 A1*    3/2012    Maini ............... G06Q 50/06
                                                    700/291
(Continued)

FOREIGN PATENT DOCUMENTS

CN    111781504 A    10/2020
CN    112067999 A    12/2020
(Continued)

OTHER PUBLICATIONS

International Search Report for Application No. PCT/KR2021/018292 mailed Mar. 10, 2022, pp. 1-3.
(Continued)

*Primary Examiner* — Nathaniel R Pelton
(74) *Attorney, Agent, or Firm* — Bryan Cave Leighton Paisner LLP

(57) ABSTRACT

A secondary battery diagnosing technology capable of effectively diagnosing a state of a secondary battery using a charge and discharge signal of the secondary battery, including a memory unit configured to store a positive electrode reference profile and a negative electrode reference profile for charge or discharge of a reference battery, a voltage measuring unit configured to measure a voltage of a target battery during a charge or discharge process, and a processor configured to generate a charge and discharge measurement profile based on the voltage, compare a simulation profile obtained from the positive electrode reference profile and the negative electrode reference profile with the generated charge and discharge measurement profile, and determine a (Continued)

positive electrode adjustment profile and a negative electrode adjustment profile so that an error between the simulation profile and the charge and discharge measurement profile is within a predetermined level.

11 Claims, 10 Drawing Sheets

(58) Field of Classification Search
USPC .......................................................... 320/128
See application file for complete search history.

(56) References Cited

U.S. PATENT DOCUMENTS

| | | |
|---|---|---|
| 2015/0022157 A1 | 1/2015 | Takahashi |
| 2015/0066407 A1 | 3/2015 | Joe et al. |
| 2016/0204639 A1 | 7/2016 | Honkura et al. |
| 2016/0259011 A1 | 9/2016 | Joe |
| 2017/0146610 A1 | 5/2017 | Cha et al. |
| 2019/0079136 A1* | 3/2019 | Lim .................. G01R 31/388 |
| 2019/0123574 A1 | 4/2019 | Jung et al. |
| 2020/0150183 A1 | 5/2020 | Yoon et al. |
| 2020/0182943 A1 | 6/2020 | Lim et al. |
| 2020/0393518 A1 | 12/2020 | Takegami et al. |
| 2021/0156923 A1 | 5/2021 | Nam et al. |
| 2022/0085635 A1* | 3/2022 | Subbaraman ....... H02J 7/00719 |

FOREIGN PATENT DOCUMENTS

| | | |
|---|---|---|
| EP | 2325664 A1 | 5/2011 |
| EP | 3396396 A1 | 10/2018 |
| EP | 3598156 A1 | 1/2020 |
| JP | 2015523547 A | 8/2015 |
| JP | 2016-024149 A | 2/2016 |
| JP | 6091822 B2 | 3/2017 |
| JP | 2018524602 A | 8/2018 |
| JP | 2019184581 A | 10/2019 |
| KR | 101504804 B1 | 3/2015 |
| KR | 20160048585 A | 5/2016 |
| KR | 101972521 B1 | 4/2019 |
| KR | 20190045736 A | 5/2019 |
| KR | 20190073065 A | 6/2019 |
| KR | 20190084686 A | 7/2019 |
| KR | 20190106126 A | 9/2019 |
| KR | 102156404 B1 | 9/2020 |
| WO | 2014128902 A1 | 8/2014 |
| WO | 2015045015 A1 | 4/2015 |

OTHER PUBLICATIONS

Meixian Tan et al., "Effect of initial temperature on electrochemical and thermal characteristics of a lithium-ion battery during charging process", Applied Thermal Engineering, Pergamon, Oxford, GB, vol. 177, May 22, 2020, XP086184102, ISSN: 1359-4311, DOI: 10.1016/J.APPLTHERMALENG.2020.115500 [retrieved on May 22, 2020] *Sections 2, 3*.

* cited by examiner

SECONDARY BATTERY DIAGNOSING APPARATUS AND METHOD

CROSS-REFERENCE TO RELATED APPLICATIONS

The present application is a national phase entry under 35 U.S.C. § 371 of International Application No. PCT/KR2021/018292 filed Dec. 3, 2021, which claims priority from Korean Patent Application No. 10-2020-0184944 filed Dec. 28, 2020, all of which are incorporated herein by reference.

TECHNICAL FIELD

The present disclosure relates to a secondary battery diagnosing technology, and more particularly, to a battery diagnosing technology capable of effectively diagnosing a state of a secondary battery using a charge and discharge signal of the secondary battery.

BACKGROUND ART

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

Moreover, recently, secondary batteries have been widely used for driving or energy storage in medium and large-sized devices such as electric vehicles or energy storage systems (ESS). In addition, for this reason, the interest in secondary batteries is further increased, and related research and development are being made more actively.

The lithium secondary battery mainly uses lithium-based oxide and carbon material as positive electrode active material and negative electrode active material, respectively. Also, the lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

A secondary battery, namely a battery, generates electrical energy through electrochemical oxidation and reduction reactions. However, as the charge/discharge cycle is repeated, the secondary battery does not maintain the capacity at the time of initial manufacture, namely the performance in a BOL (Beginning Of Life) state, and may be degraded over time. If the degradation state of the secondary battery is not properly understood, it may be difficult to accurately predict the state of charge (SOC), usable time, lifespan, replacement timing, or the like of the battery. In addition, if the prediction is not made accurately in this aspect, it may cause unexpected damage to a user or manager of the secondary battery.

Moreover, defective batteries may occur in the process of manufacturing secondary batteries. For example, among many manufactured batteries, secondary batteries that do not have the capacity or use area as designed due to process errors may appear. Even if such a defective secondary battery is unavoidably manufactured, it is necessary to ensure that the defective secondary battery is not shipped to the outside through inspection. Or, even if the defective secondary battery is shipped to the outside, it is desirable to receive a defective diagnosis at the beginning of use of the defective secondary battery.

In this regard, various techniques for diagnosing the degree of degradation during use of the secondary battery or whether there is a defect during the manufacture of the secondary battery have been proposed. However, in the case of the diagnostic techniques proposed so far, there are several problems, such as a relatively complex calculation method or low accuracy. Therefore, there is still a need for an efficient secondary battery diagnosis technology that is simpler and more accurate.

SUMMARY

Technical Problem

The present disclosure is designed to solve the problems of the related art, and therefore the present disclosure is directed to providing a secondary battery diagnosing apparatus and method, which may diagnose a state of a secondary battery using a charge and discharge signal extracted from the secondary battery, and a battery pack including the diagnosing apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a secondary battery diagnosing apparatus, comprising: memory configured to store a positive electrode reference profile and a negative electrode reference profile for charge or discharge of a reference battery; a voltage sensor configured to measure a voltage of a target battery during a charge or discharge process; and a processor configured to generate a charge and discharge measurement profile based on the measured voltage, compare a simulation profile obtained from the positive electrode reference profile and the negative electrode reference profile with the generated charge and discharge measurement profile, and compare a simulation profile obtained from the positive electrode reference profile and the negative electrode reference profile with the generated charge and discharge measurement profile.

Here, each positive electrode reference profile and each negative electrode reference profile may include a first axis representing a capacity of the battery and a second axis representing the voltage of the battery.

In addition the processor may be configured to determine the positive electrode adjustment profile and the negative electrode adjustment profile by moving at least one of the positive electrode reference profile and the negative electrode reference profile in a direction of the first axis.

In addition, the processor may be configured to determine the positive electrode adjustment profile and the negative electrode adjustment profile by adjusting a scale of at least one of the positive electrode reference profile and the negative electrode reference profile along the first axis.

In addition, the voltage sensor may be configured to measure a full discharge voltage and a full charge voltage of the target battery, and the processor may be configured to estimate a positive electrode starting value of the positive electrode adjustment profile or a negative electrode starting value of the negative electrode adjustment profile based on the full discharge voltage and estimate a positive electrode final value of the positive electrode adjustment profile and a negative electrode final value of the negative electrode adjustment profile based on the full charge voltage.

In addition, the processor may be configured to identify a capacity of the target battery based on a difference between the positive electrode final value and the positive electrode starting value or a difference between the negative electrode final value and the negative electrode starting value.

In addition, the processor may be configured to identify a positive electrode nonuse area and a negative electrode nonuse area of the target battery based on the positive electrode adjustment profile and the negative electrode adjustment profile, respectively.

In addition, in response to the error between the simulation profile and the charge and discharge measurement profile being reduced by moving the simulation profile in a direction of the second axis, the processor may be configured to determine whether the movement of the simulation profile causes an internal resistance of the target battery to increase.

In another aspect of the present disclosure, there is also provided a battery pack, comprising the secondary battery diagnosing apparatus according to any embodiment of the present disclosure.

In still another aspect of the present disclosure, there is also provided a vehicle, comprising the secondary battery diagnosing apparatus according to any embodiment of the present disclosure.

In still another aspect of the present disclosure, there is also provided a secondary battery diagnosing method, comprising: storing, at memory, a positive electrode reference profile and a negative electrode reference profile for charge or discharge of a reference battery; measuring, by a voltage sensor, a voltage of a target battery while charging or discharging the target battery; generating, by a processor, a charge and discharge measurement profile based on the measured voltage; comparing, by the processor, a simulation profile obtained from the positive electrode reference profile and the negative electrode reference profile stored with the charge and discharge measurement profile; and determining, by the processor, a positive electrode adjustment profile and a negative electrode adjustment profile by adjusting an error between the simulation profile and the charge and discharge measurement profile to within a predetermined level.

Advantageous Effects

According to one embodiment of the present disclosure, the state of the secondary battery may be accurately diagnosed in a simple manner using a charge and discharge signal.

In particular, in the present disclosure, a positive electrode voltage profile and a negative electrode voltage profile may be extracted from the charge and discharge voltage profile of the secondary battery, even if the secondary battery is not disassembled or manufactured in the form of a three-electrode cell.

According to one embodiment of the present disclosure, the state of the secondary battery may be effectively diagnosed during use of the secondary battery.

In addition, according to another embodiment of the present disclosure, the present disclosure may be applied to the manufacturing process of the secondary battery, for example the formation process of the secondary battery, to confirm whether the manufactured secondary battery has properly designed specifications.

Moreover, in the present disclosure, since the secondary battery is diagnosed in a non-destructive way, it is possible to continuously use, manufacture and ship a secondary battery with no abnormality as a result of diagnosis.

In addition, according to an embodiment of the present disclosure, the degree of degradation of the secondary battery, more particularly the degree of degradation of the positive electrode and the degree of degradation of the negative electrode, may be diagnosed, respectively.

Also, according to one embodiment of the present disclosure, there is no need to store a large amount of reference data or reference values in a storage device such as a memory unit. Therefore, a high-capacity memory unit is not required, and the effort, time and cost for securing a large amount of reference data or reference values may be reduced.

In addition, according to one embodiment of the present disclosure, in diagnosing the state of the secondary battery, a differential profile such as dV/dQ and dQ/dV may not be used. Therefore, the performance or capacity of the processor is not required to a high degree, and rapid operation may be possible.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
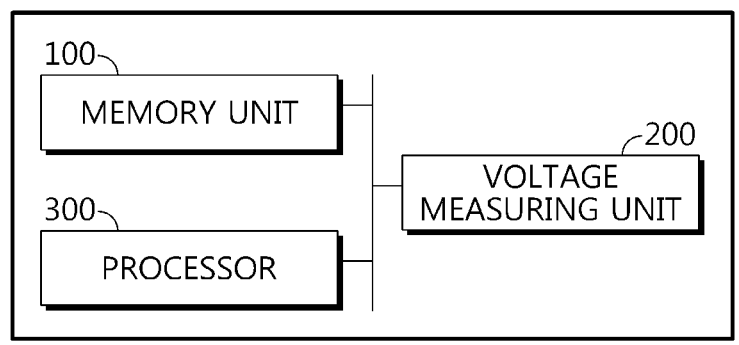
FIG. 1 is a block diagram schematically showing a functional configuration of a secondary battery diagnosing apparatus according to an embodiment of the present disclosure.

FIG. 1 is a block diagram schematically showing a functional configuration of a secondary battery diagnosing apparatus according to an embodiment of the present disclosure.

Referring to FIG. 1, the secondary battery diagnosing apparatus according to the present disclosure may include a memory unit 100, a voltage measuring unit 200, and a processor 300.

The memory unit 100 may store a positive electrode reference profile and a negative electrode reference profile for charge or discharge of a reference battery. Here, the reference battery may be a secondary battery of the same type as a secondary battery to be diagnosed, or a secondary battery designed to have the same characteristics as a secondary battery to be diagnosed. With respect to the reference battery, a positive electrode profile and a negative electrode profile may be extracted while undergoing a charge and/or discharge process in advance. In this case, the charge and discharge process may be performed at the same or similar C-rate as in the charge and discharge process performed when the voltage measuring unit 200, explained later, measures a voltage of the target battery. In addition, the extracted profile may be stored in the memory unit 100 as a positive electrode reference profile and a negative electrode reference profile. Here, in order to obtain a positive electrode reference profile and a negative electrode reference profile, the reference battery may be manufactured in the form of a three-electrode cell or a coin half-cell, but the present disclosure is not necessarily limited to this form.

Figure 2:
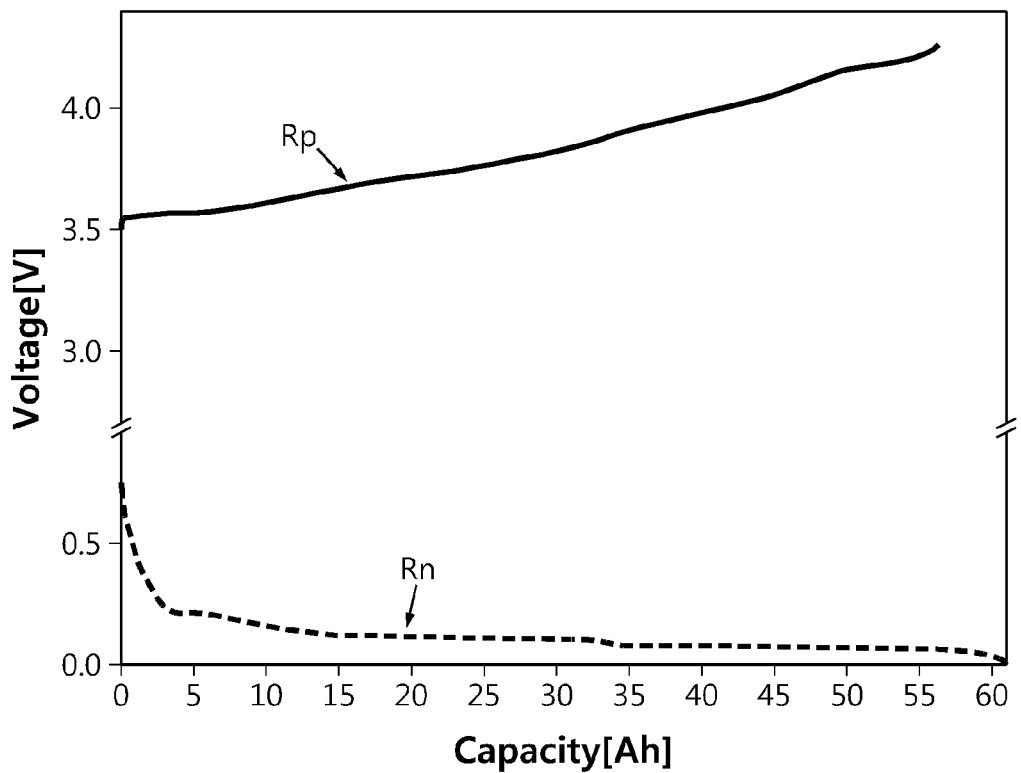
FIG. 2 is a graph showing an example of a positive electrode reference profile and a negative electrode reference profile stored in a memory unit according to an embodiment of the present disclosure.

FIG. 2 is a graph showing an example of a positive electrode reference profile and a negative electrode reference profile stored in the memory unit 100 according to an embodiment of the present disclosure.

Referring to FIG. 2, the memory unit 100 may store a positive electrode reference profile Rp and a negative electrode reference profile Rn. In this case, the positive electrode reference profile Rp and the negative electrode reference profile Rn may be a capacity-voltage graph displayed on a coordinate system in which the horizontal axis represents a capacity (Ah) and the vertical axis represents a voltage (V). For example, the positive electrode reference profile Rp may be a profile indicating a positive electrode voltage for each capacity measured while charging a three-electrode cell or a positive electrode half-cell, which is a reference battery. In addition, the negative electrode reference profile Rn may be a profile indicating a negative electrode voltage for each capacity measured while charging a three-electrode cell or a negative electrode half-cell, which is a reference battery.

In particular, in the present disclosure, as shown in FIG. 2, the memory unit 100 may store each of the positive electrode reference profile Rp and the negative electrode reference profile Rn one by one. For example, the memory unit 100 may store one positive electrode reference profile Rp and one negative electrode reference profile Rn obtained while charging the reference battery. That is, the memory unit 100 may not store a plurality of positive electrode reference profiles Rp and a plurality of negative electrode reference profiles Rn.

In addition to the above, the memory module 100 may further store data or programs required for other components of the battery diagnosing apparatus according to the present disclosure, such as the voltage measuring unit 200 or the processor 300, to operate or perform their functions.

The memory module 100 may be implemented as at least one of flash memory type, hard disk type, SSD (Solid State Disk) type, SDD (Solid Disk Drive) type, multimedia card micro type, RAM (RAM, Random Access Memory) type, SRAM (Static RAM) type, ROM (Read Only Memory) type, EEPROM (Electrically Erasable Programmable Read Only Memory) type, and PROM (Programmable Read Only Memory) type, but the present disclosure is not necessarily limited to such a specific form of the memory module 100.

The voltage measuring unit 200 may be configured to measure the voltage of the target battery during the charge or discharge process of the target battery. Here, the target battery means a battery to be diagnosed. For example, the target battery may be a secondary battery before it is shipped from a manufacturing plant, and it may be diagnosed whether there is a defect in the manufacturing process or whether it is manufactured to have the characteristics as designed. Alternatively, the target battery may be a secondary battery that is mounted in a battery pack or the like and is in use, and it may be diagnosed whether it is defective or to what extent it is degraded.

The voltage measuring unit 200 may be configured to measure a voltage while charging or discharging the target battery. In this case, the voltage measuring unit 200 may be configured to measure a charge voltage or a discharge voltage as it is, rather than an open circuit voltage (OCV) of the target battery. That is, the voltage measuring unit 200 may be configured to measure a closed circuit voltage (CCV) of the target battery. In this case, the resistance characteristic of the target battery may be estimated more accurately. This will be described later.

The voltage measuring unit 200 desirably measure the voltage of the target battery while charging and discharging at the same or similar C-rate as the C-rate of the charge and discharge process performed to measure the positive electrode reference profile Rp and the negative electrode reference profile Rn stored in the memory unit 100 above. In this case, it is possible to prevent erroneous diagnosis of the target battery due to the C-rate difference.

The voltage measuring unit 200 may employ various voltage measuring technologies known at the time of filing of this application. For example, the voltage measuring unit 200 may include a known voltage sensor at the time of filing of this application. In particular, when the secondary battery diagnosing apparatus according to the present disclosure is applied to a battery pack, a voltage sensor already provided in the battery pack may be used as the voltage measuring unit 200 according to the present disclosure.

The processor 300 may generate a charge and discharge measurement profile based on the voltage measured by the voltage measuring unit 200. That is, when the voltage is measured by the voltage measuring unit 200, voltage measurement information may be transmitted from the voltage measuring unit 200 to the processor 300. In addition, the processor 300 may generate a charge and discharge measurement profile for the target battery based on the transmitted voltage measurement information. Here, the charge and discharge measurement profile may be a charge voltage profile measured in the charge process of the target battery or a discharge voltage profile measured in the discharge process of the target battery.

Figure 3:
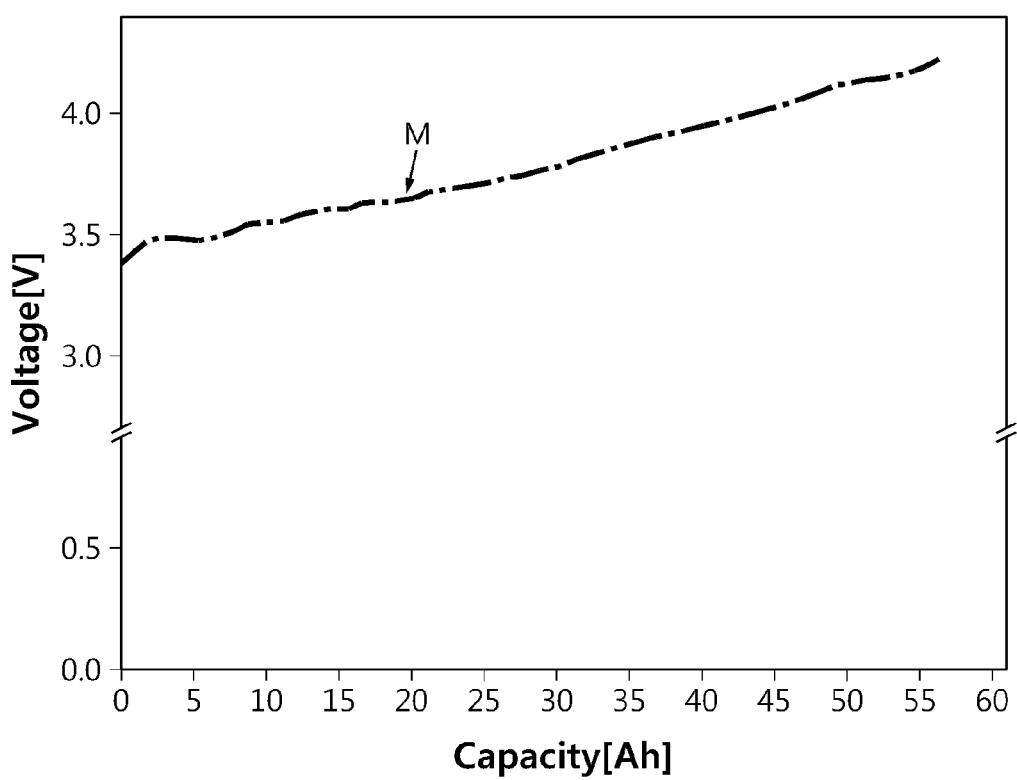
FIG. 3 is a graph showing an example of a charge and discharge measurement profile generated by a processor according to an embodiment of the present disclosure.

FIG. 3 is a graph showing an example of a charge and discharge measurement profile generated by the processor 300 according to an embodiment of the present disclosure.

Referring to FIG. 3, the processor 300 may generate a graph indicating the voltage of the target battery for each capacity based on the voltage value information measured during the charge or discharge process of the target battery. That is, in the processor 300 may generate a charge and discharge profile indicating the voltage change according to the capacity of the target battery on a coordinate system where the horizontal axis (x-axis) represents the capacity of the battery and the vertical axis (y-axis) represents the voltage of the battery. For example, when the capacity increases as 0 Ah, 5 Ah, 10 Ah, 15 Ah, . . . in the charge process of the target battery, the processor 300 may derive a voltage change graph for each capacity as indicated by M in FIG. 3 by matching the voltage measurement value received for each capacity with each capacity. In addition, the voltage change graph for each capacity derived in this way may be the charge and discharge measurement profile.

In particular, the charge and discharge measurement profile M generated by the processor 300 may be a profile indicating a charge voltage or a discharge voltage according to the capacity of the target battery as it is. That is, the charge and discharge measurement profile may not be an open circuit voltage (OCV) profile of the target battery, but may be a closed circuit voltage (CCV) profile directly measured during a charge or discharge process for the target battery.

Meanwhile, in the embodiments of FIGS. 2 and 3, the unit of the horizontal axis is expressed as Ah and the unit of the vertical axis is expressed as V, but these units may be expressed in other forms. For example, the capacity unit of the horizontal axis may be expressed as %.

If the charge and discharge measurement profile is generated as above, the processor 300 may be configured to compare the generated charge and discharge measurement profile with a simulation profile. Here, the simulation profile may be a full-cell voltage profile obtained from the positive electrode reference profile and the negative electrode reference profile stored in the memory unit 100. That is, as shown in FIG. 2, when the positive electrode reference profile Rp and the negative electrode reference profile Rn are stored in the memory unit 100, the difference between the positive electrode reference profile Rp and the negative electrode reference profile Rn may be a full-cell type charge and discharge voltage profile. In addition, the simulation profile may mean a full-cell type charge and discharge voltage profile for the reference battery. Therefore, like the positive electrode reference profile Rp and the negative electrode reference profile Rn, the simulation profile may appear in the form of a voltage graph for each capacity.

The simulation profile may be obtained to be directly generated by the processor 300 using the positive electrode reference profile Rp and the negative electrode reference profile Rn stored in the memory unit 100. Alternatively, the simulation profile may be previously calculated based on the positive electrode reference profile Rp and the negative electrode reference profile Rn and stored in the memory unit 100. In this case, the processor 300 may access the memory unit 100 to obtain the simulation profile in the form of reading.

When the simulation profile is obtained in this way, the processor 300 may compare the obtained simulation profile with the generated charge and discharge measurement profile. This will be described in more detail with reference to FIG. 4.

Figure 4:
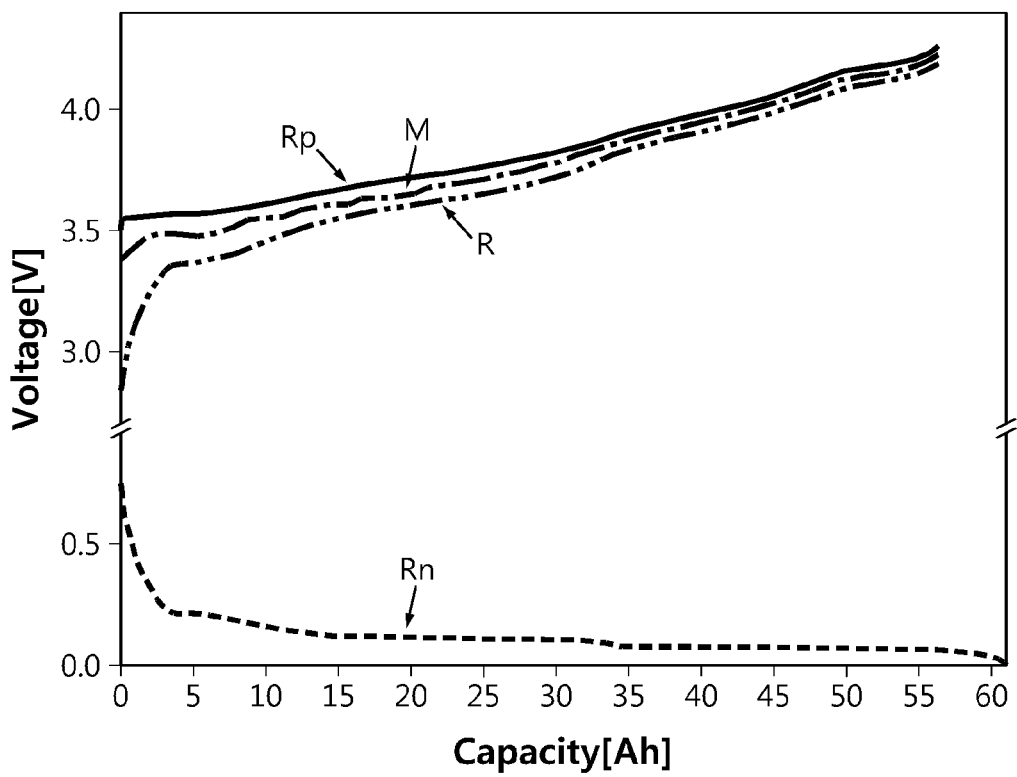
FIG. 4 is a graph comparatively showing a charge and discharge measurement profile and a simulation profile according to an embodiment of the present disclosure.

FIG. 4 is a graph comparatively showing a charge and discharge measurement profile M and a simulation profile R according to an embodiment of the present disclosure.

Referring to FIG. 4, the charge and discharge measurement profile generated by the processor 300 based on the information transmitted by the voltage measuring unit 200 is denoted by M. In addition, the simulation profile obtained from the positive electrode reference profile Rp and the negative electrode reference profile Rn stored in the memory unit 100 is denoted by R. Here, the charge and discharge measurement profile M may be a voltage profile for each capacity measured from the secondary battery to be diagnosed, namely the target battery, and the simulation profile R may be a profile of the reference battery stored in advance or obtained therefrom to be compared with the profile of the target battery.

Meanwhile, in FIG. 4, the positive electrode reference profile Rp and the negative electrode reference profile Rn are as shown in the embodiment of FIG. 2, and the simulation profile R may be obtained from the difference between the positive electrode reference profile Rp and the negative electrode reference profile Rn. In addition, the charge and discharge measurement profile M of FIG. 4 may be regarded as shown in FIG. 3.

As shown in FIG. 4, a difference may exist between the charge and discharge measurement profile M measured from the target battery and the simulation profile R obtained in advance. For example, the simulation profile R may have a form in which the charge or discharge curve of the secondary battery appears ideally, as initially designed. In addition, the charge and discharge measurement profile M may have a form in which the charge or discharge curve of a manufactured or used secondary battery is actually shown. The processor 300 may be configured to check the difference between the simulation profile R and the charge and discharge measurement profile M.

In particular, if the secondary battery may be degraded as being used over a certain level, which may cause a change in the charge and discharge curve. In addition, even in the manufacturing process of the secondary battery, if a defect occurs due to an error in the process or the like, the charge and discharge curve may not appear as designed. The processor 300 may confirm whether there is a difference between the charge and discharge measurement profile M and the simulation profile R, especially whether the difference is within a certain error range, by comparing the charge and discharge measurement profile M with the simulation profile R.

In addition, the processor 300 may be configured to determine the positive electrode adjustment profile and the negative electrode adjustment profile such that an error between the simulation profile R and the charge and discharge measurement profile M is within a predetermined level. As described above, the simulation profile R may be first obtained based on the positive electrode reference profile Rp and the negative electrode reference profile Rn. Accordingly, when the positive electrode reference profile Rp and/or the negative electrode reference profile Rp is adjusted, the simulation profile R may also be adjusted as a result. Therefore, as shown in FIG. 4, if there is an error of a certain level or more between the simulation profile R and the charge and discharge measurement profile M, the processor 300 may adjust the positive electrode reference profile Rp and/or the negative electrode reference profile Rn so that such an error is within a certain level. In addition, the finally adjusted positive electrode reference profile Rp and the finally adjusted negative electrode reference profile Rp may become the positive electrode adjustment profile and the negative electrode adjustment profile. In particular, among a plurality of cases where the positive electrode reference profile Rp and the negative electrode reference profile Rp are adjusted, the processor 300 may determine an adjusted value of the positive electrode reference profile Rp and an adjusted value of the negative electrode reference profile Rp in a case where the error between the simulation profile R and the charge and discharge measurement profile M is smallest as the positive electrode adjustment profile and the negative electrode adjustment profile.

Here, whether the error between the simulation profile R and the charge and discharge measurement profile M is smallest may be judged using various methods for comparing an error of two graphs, known at the time of filing of this application. In particular, the simulation profile R and the charge and discharge measurement profile M may have a curved shape. Therefore, it may be judged whether the error between the simulation profile R and the charge and discharge measurement profile M is smallest, for example, by calculating an integral value of an absolute value for the region between the two curves.

According to this configuration of the present disclosure, various state information about the target battery may be obtained based on the finally determined positive electrode adjustment profile and the finally determined negative electrode adjustment profile. In particular, it may be regarded that the simulation profile by the finally determined positive electrode adjustment profile and the finally determined negative electrode adjustment profile has almost the same form as the charge and discharge measurement profile M. Hereinafter, for convenience of explanation, the full-cell voltage profile obtained by the positive electrode adjustment profile and the negative electrode adjustment profile will be called a simulation adjustment profile to be compared with the simulation profile R that is a full-cell voltage profile obtained by the initial positive electrode reference profile Rp and the negative electrode reference profile Rp.

Since the simulation adjustment profile may be identical or similar to the charge and discharge measurement profile M, the positive electrode adjustment profile and the negative electrode adjustment profile that form the simulation adjustment profile may be regarded as the positive electrode profile and the negative electrode profile for the charge and discharge measurement profile M. Therefore, according to the present disclosure, even if the target battery is not disassembled or not manufactured in the form of a three-electrode battery, a positive electrode profile and a negative electrode profile for the target battery may be obtained. In addition, if the positive electrode profile and the negative electrode profile are obtained in this way from the charge and discharge signal of the target battery, the state of the target battery may be more easily predicted using the positive electrode profile and the negative electrode profile.

In particular, according to an embodiment of the present disclosure, through the positive electrode adjustment profile and the negative electrode adjustment profile, it may be easier to predict whether a defect occurs in the manufactured secondary battery, and if occurs, it may be easier to predict what kind of defect occurs. In addition, according to an embodiment of the present disclosure, through the positive electrode adjustment profile and the negative electrode adjustment profile, it may be easier to predict whether degradation occurs in the secondary battery in use, and if occurs, it may be easier to predict to what extent or in what type the degradation occurs.

Moreover, according to an embodiment of the present disclosure, a positive electrode profile and a negative electrode profile may be obtained in a simple manner. In particular, even if only one positive electrode reference profile Rp and one negative electrode reference profile Rn are stored in the memory unit 100, the present disclosure may be implemented. That is, it is not necessary to store a plurality of positive electrode reference profiles Rp and/or a plurality of negative electrode reference profiles Rn in the memory unit 100. Therefore, the capacity of the memory unit 100 does not need to be high, and there is no need to perform many pre-tests to store the reference profile.

In addition, according to an embodiment of the present disclosure, a closed voltage profile (CCV) is used rather than an open voltage profile (OCV). Accordingly, it may be possible to measure a change in resistance during a continuous charge or discharge process. In particular, the open voltage profile may be obtained in the form of an intermediate value between the charge voltage profile and the discharge voltage profile, or may be obtained by measuring a voltage after a certain time passes in a state where the charge or discharge is stopped during the charge or discharge process and both ends of the battery are opened. Therefore, in the case of such an open voltage profile, it may be difficult to accurately measure the resistance change during a continuous charge or discharge process. However, according to the embodiment of the present disclosure, by using the charge voltage profile or the discharge voltage profile measured in a state where the charge and discharge current flows instead of the open voltage profile, the resistance change may be accurately measured in the continuous charge or discharge process.

The processor 300 may optionally include central processing units (CPUs), application-specific integrated circuits (ASIC), chipsets, logic circuits, registers, communication modems, data processing devices, or the like, known in the art, to execute various control logics performed in the present disclosure, or may be expressed using these terms. In addition, when a control logic is implemented in software, the processor 300 may be implemented as a set of program modules. In this case, the program module may be stored in an internal memory or an external memory unit 100 or the like and executed by the processor 300. The memory unit 100 may be provided inside or outside the processor 300, and may be connected to the processor 300 through various well-known means.

In particular, if the diagnosing apparatus according to the present disclosure is implemented in the form of being included in a battery pack, the battery pack may include a control device that is referred to as a microcontroller unit (MCU) or a battery management system (BMS). At this time, the processor 300 may be implemented by components such as the MCU or the BMS provided in a general battery pack.

Meanwhile, in this specification, terms such as 'to be' or 'configured to be' for an operation or function of the processor 300 may include the meaning of 'programmed to be'.

Preferably, the processor 300 may be configured to determine the positive electrode adjustment profile and the negative electrode adjustment profile by moving the positive electrode reference profile Rp and/or the negative electrode reference profile Rn on the coordinate axis. This will be described in more detail with reference to FIG. 5.

Figure 5:
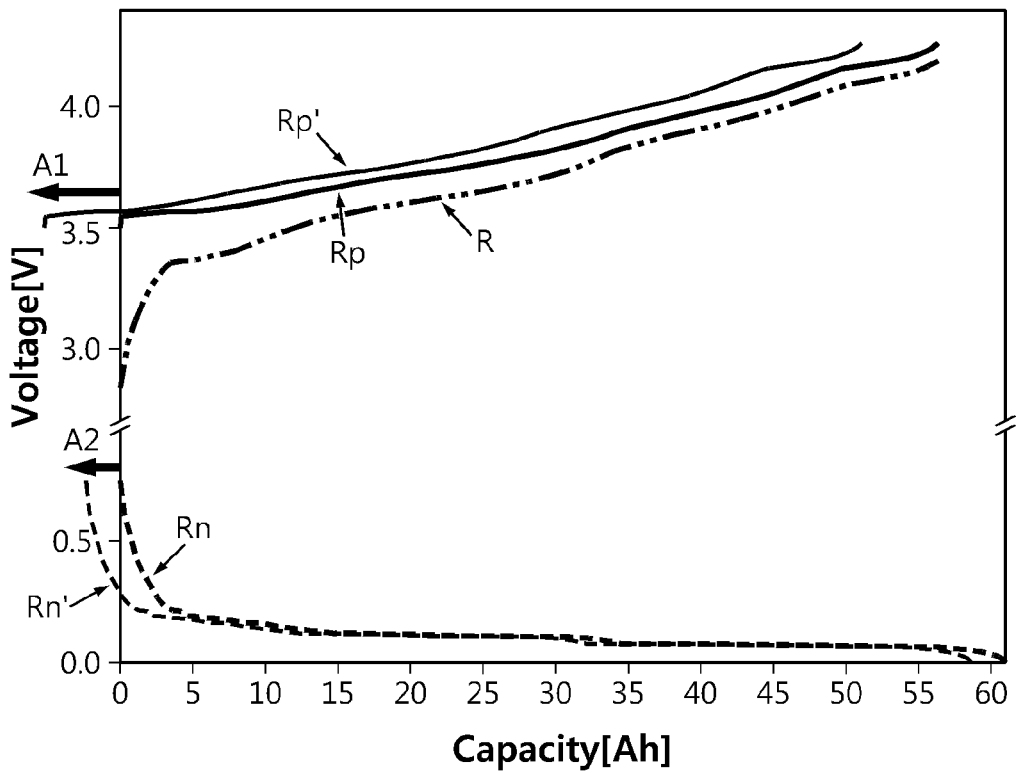
FIG. 5 is a graph showing an example of a configuration in which the processor according to an embodiment of the present disclosure moves the reference profile.

FIG. 5 is a graph showing an example of a configuration in which the processor 300 according to an embodiment of the present disclosure moves the reference profile. For this embodiment and other embodiments below, features different from those of the former embodiment will be described in detail, and features identical or similar to those of the former embodiment will not be described in detail.

Referring to FIG. 5, similar to FIG. 2, the positive electrode reference profile and the negative electrode reference profile stored in the memory unit 100 are denoted by Rp and Rn, respectively. Here, the positive electrode reference profile Rp and the negative electrode reference profile Rn may be expressed in the form of voltage for each capacity.

The processor 300 may move at least one reference profile of the positive electrode reference profile Rp and the negative electrode reference profile Rn in a horizontal direction. For example, the processor 300 may move the positive electrode reference profile indicated by Rp in the −x-axis direction, as indicated by the arrow A1. In this case, the positive electrode reference profile may be displayed on the coordinate plane in a position and shape as indicated by Rp'. Also, the processor 300 may move the negative electrode reference profile indicated by Rn in the −x-axis direction, as indicated by the arrow A2. In this case, the negative electrode reference profile may be displayed on the coordinate axis in a position and shape as indicated by Rn'.

If the processor 300 moves at least one reference profile of the positive electrode reference profile Rp and the negative electrode reference profile Rn as above, the position and/or shape of the simulation profile indicated by R may be changed. Accordingly, the processor 300 may move the positive electrode reference profile Rp and the negative electrode reference profile Rn so that the position and/or shape of the adjusted simulation profile, namely the simulation adjustment profile, matches the position and/or shape of the charge and discharge measurement profile M as much as possible. In FIG. 5, the shape of the positive electrode reference profile before movement is indicated by Rp, and the shape thereof after movement is indicated by Rp'. In addition, the shape of the negative electrode reference profile before movement is indicated by Rn, and the shape thereof after movement is indicated by Rn'. In addition, if the simulation profile R is adjusted by moving the positive electrode reference profile and the negative electrode reference profile to match the charge and discharge measurement profile M or to have an error within a certain level, the positive electrode profile indicated by Rp' and the negative electrode profile indicated by Rn' may be determined as a positive electrode adjustment profile and a negative electrode adjustment profile, respectively.

In addition, it may be regarded that the positive electrode adjustment profile Rp' and the negative electrode adjustment profile Rn' determined in this way represent the positive electrode profile and the negative electrode profile for the charge and discharge measurement profile M of the target battery.

Meanwhile, in FIG. 5, the positive electrode reference profile Rp and the negative electrode reference profile Rn are described as being moved in the horizontal direction (x-axis direction), but the positive electrode reference profile Rp and the negative electrode reference profile Rn may be moved in a vertical direction (y-axis direction) or in a diagonal direction to obtain the positive electrode adjustment profile Rp' and the negative electrode adjustment profile Rn'.

In addition, the processor 300 may be configured to determine the positive electrode adjustment profile Rp' and the negative electrode adjustment profile Rn' by adjusting a scale of the positive electrode reference profile Rp and/or the negative electrode reference profile Rn on the coordinate system. This will be described in more detail with reference to FIG. 6.

Figure 6:
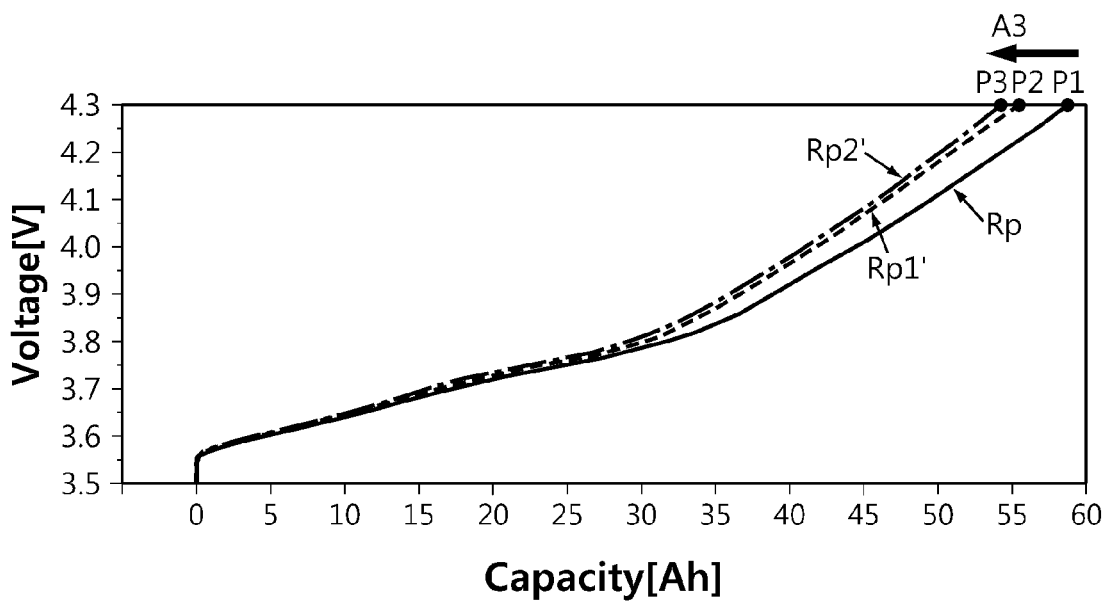
FIG. 6 is a graph showing an example of a configuration in which the processor according to an embodiment of the present disclosure adjusts a scale of the reference profile.

FIG. 6 is a graph showing an example of a configuration in which the processor 300 according to an embodiment of the present disclosure adjusts a scale of the reference profile.

Referring to FIG. 6, the processor 300 may be configured to adjust the scale of the positive electrode reference profile Rp stored in the memory unit 100 in the horizontal direction, namely in the x-axis direction. In particular, the processor 300 may adjust the scale of the positive electrode reference profile Rp to shrink, as indicated by the arrow A3. Alternatively, the processor 300 may adjust the scale of the positive electrode reference profile Rp to expand in a direction opposite to the arrow A3. This scale adjustment may be called horizontal scale adjustment. In particular, when the secondary battery is degraded or defective, the positive electrode profile Rp and/or the negative electrode profile Rn is often shrunken, so the processor 300 adjust the scale of the positive electrode reference profile Rp and/or the negative electrode reference profile Rn to shrink.

More specifically, with respect to the positive electrode reference profile indicated by Rp, the processor 300 may move a point having a maximum capacity and in a full charge state along the A3 direction, which is the horizontal direction, in a state where a point having 0 (zero) capacity in a full discharge state is fixed. That is, the processor 300 may move the point P1 corresponding to the charge end voltage (4.3V in the figure) in the −x-axis direction while the point corresponding to the charge start voltage (3.5 V in the figure) is fixed. In addition, by moving the distal end as above, the positive electrode reference profile may be shrunken.

For example, if the positive electrode reference profile Rp is shrunken by 6%, the capacity of the full charge voltage may be moved from the point P1 to the point P2. In this case, the positive electrode adjustment profile Rp1' may be formed. In addition, if the positive electrode reference profile Rp is shrunken by 8%, the point P1 may be moved to the P3 point. In this case, the positive electrode adjustment profile may be formed like Rp2'. That is, in this profile, Rp2' may be shrunken more than Rp1', based on Rp.

If the error between the simulation profile R adjusted in a state where the positive electrode reference profile Rp is shrunken like Rp1' and the charge and discharge measurement profile M is within a certain level, the processor 300 may determine that the Rp1' profile is a positive electrode adjustment profile. Meanwhile, if the error between the simulation profile R adjusted in a state where the positive electrode reference profile Rp is shrunken like Rp2' and the charge and discharge measurement profile M is within a certain level, the processor 300 may determine that the Rp2' profile is a positive electrode adjustment profile.

Meanwhile, in the embodiment of FIG. 6, a configuration for adjusting the scale of the positive electrode reference profile Rp is described, but the scale of the negative electrode reference profile Rn may also be adjusted in a similar manner. Here, the scale adjusting ratio of the negative electrode reference profile Rn may be the same as or different from the scale adjusting ratio of the positive electrode reference profile Rp.

In particular, in the secondary battery diagnosing apparatus according to the present disclosure, the processor 300 may determine the positive electrode adjustment profile Rp' and the negative electrode adjustment profile Rn' by moving the positive electrode reference profile Rp and/or the negative electrode reference profile Rn in the horizontal direction as shown in FIG. 5 and simultaneously adjusting, for example reducing, the scale of the positive electrode reference profile Rp and/or the negative electrode reference profile Rn in the horizontal direction as shown in FIG. 6.

According to this embodiment of the present disclosure, a positive electrode profile and a negative electrode profile for the charge and discharge measurement profile M of the target battery may be obtained in a simple manner. In particular, according to the embodiment of the present disclosure, there is no need to store a lot of data for the positive electrode reference profile Rp and the negative electrode reference profile Rn. Therefore, according to this embodiment of the present disclosure, a memory unit 100 and a processor 300 having a high capacity or high performance may not be provided.

If the scale of the positive electrode reference profile Rp and/or the negative electrode reference profile Rn is adjusted, particularly to be shrunken, in the horizontal direction as in this embodiment in order to minimize the error between the charge and discharge measurement profile M and the simulation profile R, the processor 300 may estimate a positive electrode degradation rate and/or a negative electrode degradation rate through the shrinkage value.

For example, if the positive electrode adjustment profile Rp' is obtained by shrinking the positive electrode reference profile Rp by 3% in a state where the capacity value of positive electrode reference profile Rp at the charge end voltage 100 [Ah] in order to minimize the error between the charge and discharge measurement profile M and the simulation profile R, the capacity value of the positive electrode adjustment profile Rp' at the charge end voltage may become 97 [Ah]. In this case, the shrinkage value for the positive electrode reference profile Rp may be regarded as 3%. Accordingly, the processor 300 may judge that the positive electrode degradation rate is 3%.

In addition, if the negative electrode adjustment profile Rn' is obtained by shrinking the negative electrode reference profile Rn by 0.1% in a state where the capacity value of the negative electrode reference profile Rn at the charge end voltage is 100 [Ah] in order to minimize the error between the charge and discharge measurement profile M and the simulation profile R, the capacity value of the negative electrode adjustment profile Rn' at the charge end voltage may become 99.9 [Ah]. In this case, the shrinkage value for the negative electrode reference profile Rn may be regarded as 0.1%. Accordingly, the processor 300 may judge that the negative electrode degradation rate is 0.1%.

Moreover, the unit of the capacity axis in the coordinate system showing the charge and discharge measurement profile M and the simulation profile R may be expressed in [%] instead of [Ah]. In this case, the shrinkage value may be obtained more easily.

According to this embodiment of the present disclosure, the positive electrode degradation rate and/or the negative electrode degradation rate may be obtained more clearly and simply through the degree of scale adjustment of the positive electrode reference profile Rp and the negative electrode reference profile Rn, especially the degree of shrinkage. In particular, a secondary battery may not exhibit its capacity properly due to conductive path formation, gas generation, active material degradation, or the like at a certain point during manufacture or use. According to this embodiment, by adjusting the profile to be shrunken, a positive electrode profile and a negative electrode profile in which such degradation is substantially reflected may be obtained.

The voltage measuring unit 200 may be configured to measure a full discharge voltage and a full charge voltage of the target battery. Here, the full discharge voltage may mean a voltage when the target battery is in a completely discharged state, namely when the SOC (State of Charge) of the target battery is 0. In particular, the full discharge voltage may be an open circuit voltage (OCV) when the SOC is 0 (zero). In addition, the full charge voltage may mean a voltage when the target battery is in a fully charged state, namely when the SOC of the target battery is 100%. In particular, the full charge voltage may be an open circuit voltage when the SOC is 100%.

The processor 300 may estimate a positive electrode starting value of the positive electrode adjustment profile or a negative electrode starting value of the negative electrode adjustment profile based on the full discharge voltage. Here, the positive electrode starting value may be a point where the capacity is 0 (zero) on the positive electrode adjustment profile, when the positive electrode adjustment profile is determined by adjusting the positive electrode reference profile. In addition, the negative electrode starting value may be a point where the capacity is 0 (zero) on the negative electrode adjustment profile, when the negative electrode adjustment profile is determined by adjusting the negative electrode reference profile. That is, the positive electrode starting value and the negative electrode starting value may be regarded as a starting point of the positive electrode profile and a starting point of the negative electrode profile when the charge is started (full discharge) for the target battery.

The processor 300 may arbitrarily set at least one of the positive electrode starting value and the negative electrode starting value, and obtain the other one from the full discharge voltage. This will be described in more detail with reference to FIG. 7.

Figure 7:
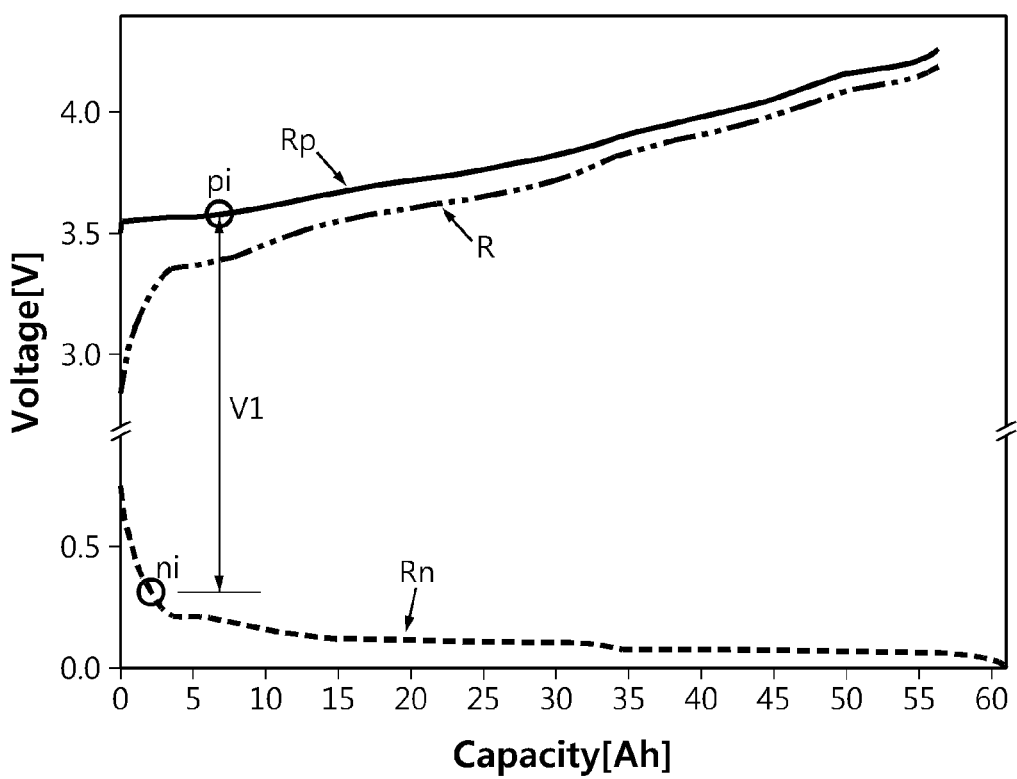
FIG. 7 is a diagram schematically showing a configuration in which the processor according to an embodiment of the present disclosure determines a positive electrode starting value and a negative electrode starting value.

FIG. 7 is a diagram schematically showing a configuration in which the processor 300 according to an embodiment of the present disclosure determines a positive electrode starting value and a negative electrode starting value.

The positive electrode reference profile Rp and the negative electrode reference profile Rn may be stored in the memory unit 100 in the form as shown in FIG. 7. Alternatively, the positive electrode reference profile Rp and the negative electrode reference profile Rn of FIG. 7 may be an adjusted reference profile after the profile stored in the memory unit 100 is moved as shown in FIG. 5 and/or is shrunken as shown in FIG. 6.

In addition, the processor 300 may set an arbitrary point, for example pi, on the positive electrode reference profile Rp as a positive electrode starting value. In this case, the positive electrode starting value may be stored in advance in the memory unit 100 or configured to be calculated by the processor 300 through a predetermined calculation method. For example, the positive electrode starting value may be configured to have a predetermined value by distinguishing whether the target battery is being manufactured or in use. Alternatively, the positive electrode starting value may be configured to have a predetermined value by being distinguished for every charge and discharge cycle number with respect to a battery in use.

If the positive electrode starting value pi is set as above, the processor 300 may determine a negative electrode starting value based on the full discharge voltage measured by the voltage measuring unit 200. For example, if the full discharge voltage, namely the voltage when the SOC of the target battery is 0, is measured as V1, the processor 300 searches for a point that is different from the positive electrode starting value by V1 on the negative electrode reference profile Rn. In FIG. 7, a point that is different from the positive electrode starting value by V1 is indicated by ni. In addition, the processor 300 may determine the searched point ni as a negative electrode starting value.

In addition, the processor 300 may be configured to estimate a positive electrode final value of the positive electrode adjustment profile and a negative electrode final value of the negative electrode adjustment profile based on the full charge voltage. Here, when the positive electrode adjustment profile is determined by adjusting the positive electrode reference profile, the positive electrode final value may be a point where the capacity is 100% on the positive electrode adjustment profile. In addition, when the negative electrode adjustment profile is determined by adjusting the negative electrode reference profile, the negative electrode final value may be a point where the capacity is 100% on the negative electrode adjustment profile. That is, the positive electrode final value and the negative electrode final value may be regarded as a final value of the positive electrode profile and a final value of the negative electrode profile when the target battery stops charging (full charge). This will be described in more detail with reference to FIG. 8.

Figure 8:
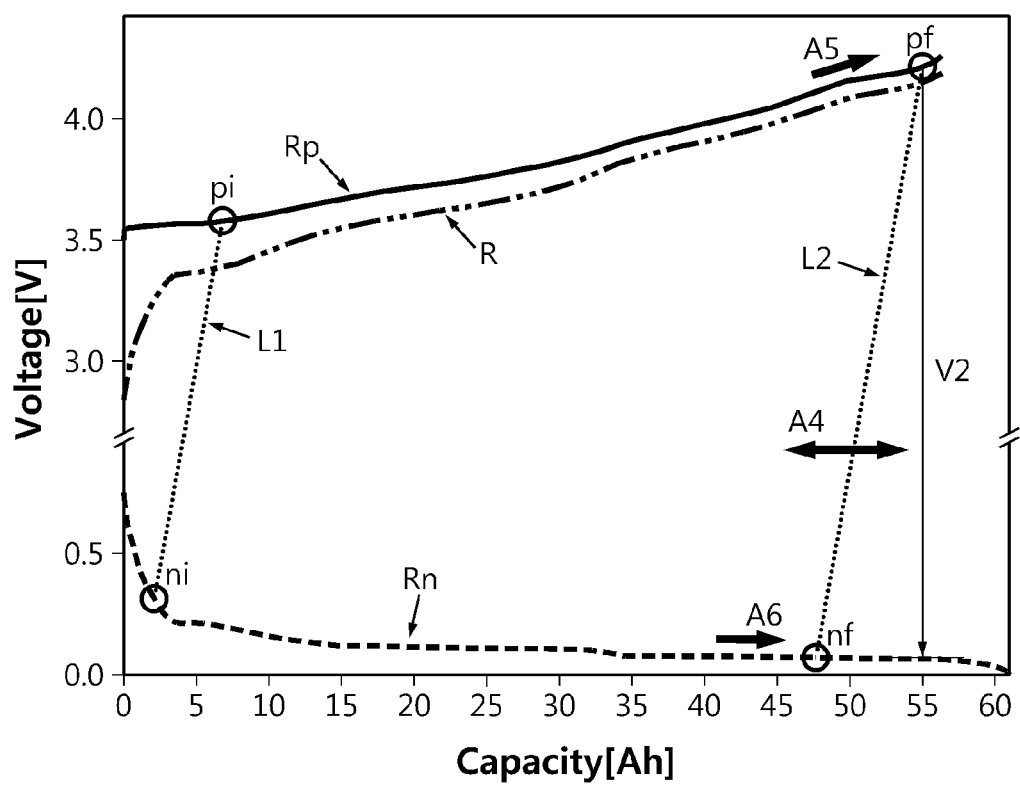
FIG. 8 is a diagram schematically showing a configuration in which the processor according to an embodiment of the present disclosure determines a positive electrode final value and a negative electrode final value.

FIG. 8 is a diagram schematically showing a configuration in which the processor 300 according to an embodiment of the present disclosure determines a positive electrode final value and a negative electrode final value.

Referring to FIG. 8, a positive electrode reference profile Rp and a negative electrode reference profile Rn are shown. As described above with reference to FIG. 7, the positive electrode reference profile Rp and the negative electrode reference profile Rn may be a profile stored in advance in the memory unit or a profile moved and/or scale-adjusted therefrom. In addition, on each reference profile, a positive electrode starting value pi and a negative electrode starting value ni are respectively indicated. The positive electrode starting value pi and the negative electrode starting value ni may be obtained as described above with reference to FIG. 7. When the positive electrode starting value pi and the negative electrode starting value ni are determined in this way, the processor 300 may obtain a straight line L1 connecting the positive electrode starting value pi and the negative electrode starting value ni.

In addition, the processor 300 may obtain another straight line L2 parallel to the straight line L1 and having both ends moving on the positive electrode reference profile Rp and the negative electrode reference profile Rn. The processor 300 may move the straight line L2 in the left and right direction as indicated by A4 in the figure. Here, if the full charge voltage of the target battery is transmitted as V2 from the voltage measuring unit 200, the processor 300 may search for a point where the voltage difference between both ends is V2 while moving the straight line L2 as indicated by the arrow A4.

In this case, when the straight line L2 moves, the processor 300 may maintain the straight line L2 in a state parallel to the straight line L1 as it is. In addition, the processor 300 may allow both ends of the straight line L2 to move only on the positive electrode reference profile Rp and the negative electrode reference profile Rn. That is, the processor 300 may allow one end of the straight line L2 to move only on the positive electrode reference profile Rp, as indicated by the arrow A5 of FIG. 8. In addition, the processor 300 may allow the other end of the straight line L2 to move only on the negative electrode reference profile Rn, as indicated by the arrow A6 of FIG. 8. In addition, when the final position of the straight line L2 parallel to L1 and where the voltage difference between both ends is V2 is determined, the processor 300 may determine the end of the straight line L2 at the final position on the positive electrode reference profile Rp as a positive electrode final value pf, and determine the end thereof on the negative electrode reference profile Rn a negative electrode final value nf.

In addition, if the positive electrode starting value pi, the negative electrode starting value ni, the positive electrode final value pf and the negative electrode final value nf are determined as above, the positive electrode adjustment profile and the negative electrode adjustment profile may be determined using the determined positive electrode starting value pi, the determined negative electrode starting value ni, the determined positive electrode final value pf, and the determined negative electrode final value nf. This will be described in more detail with reference to FIG. 9.

Figure 9:
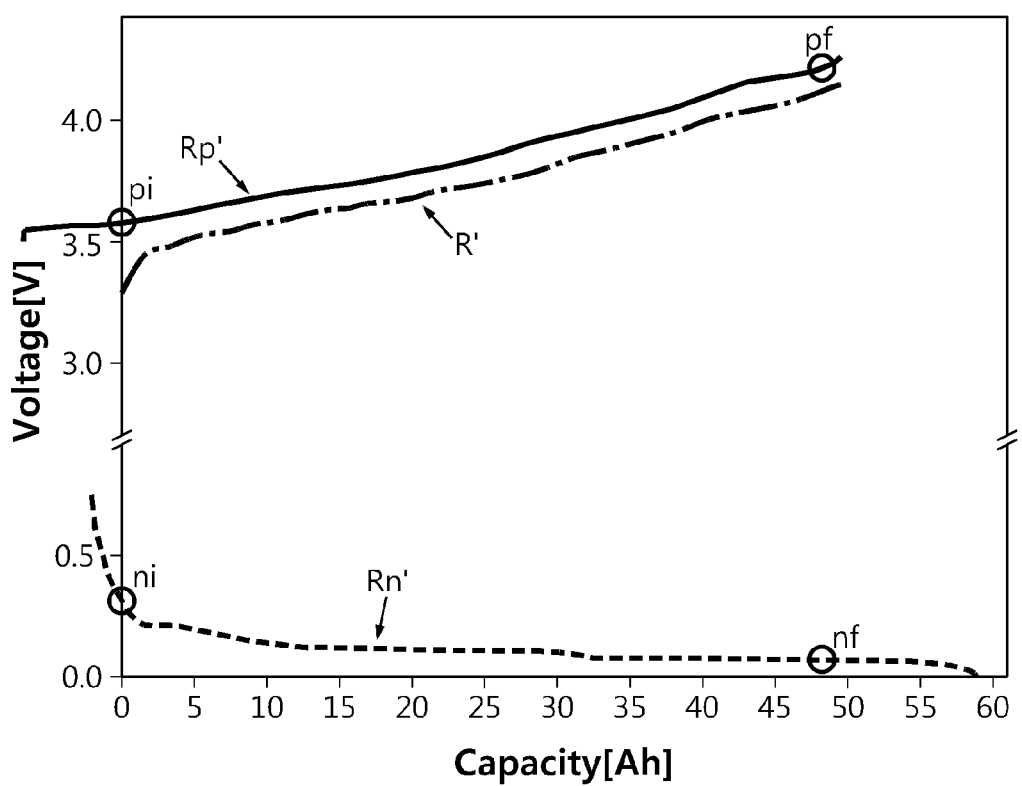
FIG. 9 is a diagram schematically showing a configuration in which the processor according to an embodiment of the present disclosure obtains a positive electrode adjustment profile and a negative electrode adjustment profile by adjusting the positive electrode reference profile and the negative electrode reference profile.

FIG. 9 is a diagram showing a configuration for obtaining a positive electrode adjustment profile Rp' and a negative electrode adjustment profile Rn' by adjusting the positive electrode reference profile Rp and the negative electrode reference profile Rn by the processor 300 according to an embodiment of the present disclosure.

Referring to FIG. 9, if the positive electrode starting value pi, the negative electrode starting value ni, the positive electrode final value pf and the negative electrode final value nf are determined as described in the embodiment of FIGS. 7 and 8 above, the positive electrode adjustment profile Rp' and the negative electrode adjustment profile Rn' may be obtained based on these values.

More specifically, the positive electrode adjustment profile Rp' and the negative electrode adjustment profile Rn' may be expressed on a coordinate plane indicating the voltage for each capacity, like the positive electrode reference profile Rp and the negative electrode reference profile Rn. In addition, the processor 300 may obtain the positive electrode adjustment profile Rp' by moving the positive electrode reference profile Rp in the horizontal direction, particularly in the −x-axis direction, so that the positive electrode starting value pi is located on the y-axis. Also, the processor 300 may obtain the negative electrode adjustment profile Rn' by adjusting the negative electrode reference profile Rn in a similar manner. In other words, the processor 300 may obtain the negative electrode adjustment profile Rn' by moving the negative electrode reference profile Rn in the horizontal direction, particularly in the −x-axis direction, so that the negative electrode starting value ni is located on the y-axis, namely so that the x-coordinate value of the negative electrode starting value ni has a capacity of 0 (zero).

If the positive electrode reference profile Rp and the negative electrode reference profile Rn are changed in this way, the full-cell voltage profile obtained from the difference between the positive electrode reference profile Rp and the negative electrode reference profile Rn may also be changed. For example, when the full-cell voltage profile appears as indicated by R in FIG. 8 before the positive electrode reference profile and the negative electrode reference profile are adjusted, if the positive electrode reference profile and the negative electrode reference profile are adjusted to change the position and/or shape, the full-cell voltage profile may also be obtained in a position and/or shape different from that of the existing R as indicated by R' in FIG. 9. In addition, when the full-cell voltage profile obtained in this way matches the charge and discharge measurement profile M of the target battery or is within a certain error range, the processor 300 may determine the adjusted positive electrode reference profile Rp' as a positive electrode adjustment profile and determine the adjusted negative electrode reference profile Rn' as a negative electrode adjustment profile.

If the full-cell voltage profile R' does not match the charge and discharge measurement profile M or out of the error range even in a state where the positive electrode reference profile and the negative electrode reference profile are changed in this way, the processor 300 may repeatedly perform the process described above with reference to the embodiments of FIGS. 7 to 9 in a state where the positive electrode starting value pi is changed to another value. Alternatively, with respect to the adjusted positive electrode profile Rp' and the adjusted negative electrode profile Rn' obtained in FIG. 9, the processor 300 may perform additional adjustment such as movement in the horizontal direction and/or shrinkage described in FIGS. 5 and 6 above.

In addition, by confirming the shape of the full-cell voltage profiles obtained through the repeated adjustment, which is most consistent with the charge and discharge measurement profile M, the final positive electrode adjustment profile and the final negative electrode adjustment profile may be determined.

Also, the processor 300 may adjust at least one of a scale in a region between the positive electrode starting value pi and the positive electrode final value pf for the positive electrode adjustment profile and a scale in a region between the negative electrode starting value ni and the negative electrode final value nf for the negative electrode adjustment profile. In addition, through this, the processor 300 may be configured so that the error between the simulation profile R and the charge and discharge measurement profile M is within a certain level.

For example, the processor 300 may adjust the scale of the positive electrode adjustment profile Rp' shown in FIG. 9 in the horizontal direction, in the form of shrinking in the horizontal direction as described in FIG. 6. More specifically, the processor 300 may shrink or expand the positive electrode reference profile Rp', which is being adjusted as shown in FIG. 9, by moving the positive electrode final value pf in the ±x-axis direction in a state where the positive electrode starting value pi is fixed on the voltage coordinate axis. In addition, the processor 300 may also adjust the scale of the negative electrode adjustment profile Rn' in the horizontal direction in a similar manner. That is, the processor 300 may shrink or expand the negative electrode adjustment profile Rn', which is being adjusted as shown in FIG. 9, by moving the negative electrode final value nf in the ±x-axis direction in a state where the negative electrode starting value ni is fixed on the voltage coordinate axis.

In addition, through the scale adjustment, the simulation adjustment profile R' and the charge and discharge measurement profile M may be made more consistent. In particular, the scale adjustment may be performed when a sufficiently satisfactory simulation adjustment profile is not obtained even through the movement of the positive electrode reference profile and/or the negative electrode reference profile in the horizontal direction as described above or when it is intended want to obtain a simulation adjustment profile R' that is more consistent with the charge and discharge measurement profile M.

Meanwhile, the scale adjustment may be performed without being limited to the region between the positive electrode starting value pi, the positive electrode final value pf, the negative electrode starting value ni and the negative electrode final value nf. In particular, the processor 300 may first perform scale adjustment before determining the positive electrode starting value pi, the positive electrode final value pf, the negative electrode starting value ni and the negative electrode final value nf. For example, the processor 300 may adjust the scale for the positive electrode reference profile and/or the negative electrode adjustment profile before determining the positive electrode starting value pi and the negative electrode starting value ni in the graph of the former embodiment of FIG. 7. In addition, the processor 300 may determine the positive electrode starting value pi, the positive electrode final value pf, the negative electrode starting value ni and the negative electrode final value nf with respect to the scale-adjusted profile.

According to this embodiment of the present disclosure, if only the charge and discharge measurement profile M of the target battery is obtained, through a relatively simple process of moving one positive electrode reference profile and one negative electrode reference profile stored in advance and/or adjusting the scale thereof, it is possible to obtain a positive electrode profile and a negative electrode profile for the charge and discharge of the target battery. In addition, through the positive electrode profile and the negative electrode profile, it is possible to obtain various information about the state of the target battery.

In particular, in this embodiment, in the process of obtaining the positive electrode profile and the negative electrode profile, capacity-differential curves such as dV/dQ or dQ/dV (Q is capacity, V is voltage) and complex types of calculations or calculations are not necessary.

In addition, in the present disclosure, it may be possible to identify the state and characteristics of a secondary battery at a specific time point, particularly in the BOL state. In addition, in the present disclosure, it may be possible to identify the state and characteristics of a secondary battery in the manufacturing process or in use.

The processor 300 may be configured to identify the capacity of the target battery based on the difference between the positive electrode final value pf and the positive electrode starting value pi. Here, the difference (pf−pi) between the positive electrode final value and the positive electrode starting value may be the same as the difference (nf−ni) between the negative electrode final value and the negative electrode starting value. Therefore, it may be regarded that the processor 300 identifies the capacity of the target battery based on the difference (nf−ni) between the negative electrode final value and the negative electrode starting value.

In particular, the processor 300 may obtain the difference (pf–pi) between the positive electrode final value and the positive electrode starting value or the difference (nf–ni) between the negative electrode starting value and the negative electrode starting value as a percentage. For example, the difference (pf–pi) between the finally estimated positive electrode final value and the positive electrode starting value may be expressed as a percentage corresponding to a criterion capacity. Here, the criterion capacity is a value to be compared with the difference (pf–pi) between the finally estimated positive electrode final value and the positive electrode starting value, and may be a value stored in advance in the memory unit 100 or the like.

As a more specific example, when the criterion capacity is 60 Ah and the difference (pf–pi) between the finally estimated positive electrode final value and the positive electrode starting value is 55 Ah, in order to express this as a percentage, the following calculation may be performed: (55/60)×100=92. At this time, the difference (pf–pi) between the positive electrode final value and the positive electrode starting value may be regarded as 92%.

As another example, in the voltage graph for each capacity used or generated by the processor 300, when the unit of the capacity axis is %, the processor 300 may calculate the difference (pf–pi) between the positive electrode final value and the positive electrode starting value from the finally obtained positive electrode adjustment profile. For example, in FIG. 9, when the capacity axis is expressed in the unit of % instead of Ah unit, the x coordinate value of the positive electrode final value pf may be regarded as a value expressing the difference (pf–pi) between the positive electrode final value and the positive electrode starting value as a percentage. That is, when the x coordinate value of the positive electrode final value pf in FIG. 9 is 91%, the processor 300 may obtain the difference (pf–pi) between the positive electrode final value and the positive electrode starting value as 91%.

If the difference (pf–pi) between the positive electrode final value and the positive electrode starting value or the difference (nf–ni) between the negative electrode final value and the negative electrode starting value is obtained as above, the processor 300 may calculate the capacity of the electrode based on this difference value. In particular, the positive electrode may have a greater influence on the capacity of the battery than the negative electrode. Accordingly, the processor 300 may calculate the capacity of the target battery in a current state by using the following equation, based on the difference between the positive electrode final value and the positive electrode starting value.

$$Capacity = a \times PL \times PA$$

Here, a is a value representing the difference (pf–pi) between the positive electrode final value and the positive electrode starting value, and may be expressed by converting a percentage (%) into a decimal unit. For example, when the difference between the positive electrode final value and the positive electrode starting value is 90%, a may be put into the equation as 0.9.

In addition, PL indicates a loading value of an active material for the positive electrode, and may be expressed as a unit representing a capacity ratio to an area, such as 3 [mAh/cm$^2$]. In addition, PA indicates a total area of the positive electrode included in one battery, and may be expressed in a unit such as [cm$^2$].

The PL and PA values may be values previously stored in the memory unit 100. Accordingly, the processor 300 may access the memory unit 100 to read the PL and PA values. In addition, a may be obtained by the processor 300 as described above. Therefore, if the values of a, PL, and PA are obtained in this way, the processor 300 may calculate the capacity of the target battery in the current state based on these values.

For example, when a is 0.9, PL is 3 [mAh/cm$^2$], and PA is 20000 [cm$^2$], the processor 300 may estimate the capacity of the target battery through the following equation.

$$Capacity = 0.9 \times 3 \times 20000 = 54000 \ [mAh] = 54 \ [Ah]$$

In this case, the processor 300 may estimate that the current capacity of the target battery is 54 [Ah].

In addition, if the capacity of the target battery is calculated in this way, the processor 300 may compare the calculated capacity with the reference capacity stored in the memory unit 100 or the like. In particular, in case of diagnosing the state of the battery in the BOL state, the processor 300 may confirm whether the calculated capacity has a value similar to the designed capacity. In addition, the processor 300 may judge whether the target battery or the batteries currently being manufactured have been manufactured to have the designed performance through this confirmation.

That is, the processor 300 may identify whether the target battery is defective or the degree of degradation by comparing the capacity estimated as above with the previously stored design capacity. For example, when the design capacity stored in the memory unit 100 is 54 Ah, the processor 300 may determine that the target battery is good since the calculated capacity value matches the design capacity. Meanwhile, when the design capacity stored in the memory unit 100 is 60 Ah, since it is different from the calculated capacity of 54 Ah, the processor 300 may judge that the target battery is defective or degraded a lot. According to this configuration of the present disclosure, the capacity of the target battery may be verified easily and simply.

The processor 300 may be configured to identify a positive electrode nonuse area and/or a negative electrode nonuse area of the target battery based on the positive electrode adjustment profile and the negative electrode adjustment profile. This will be described in more detail with reference to FIG. 10.

Figure 10:
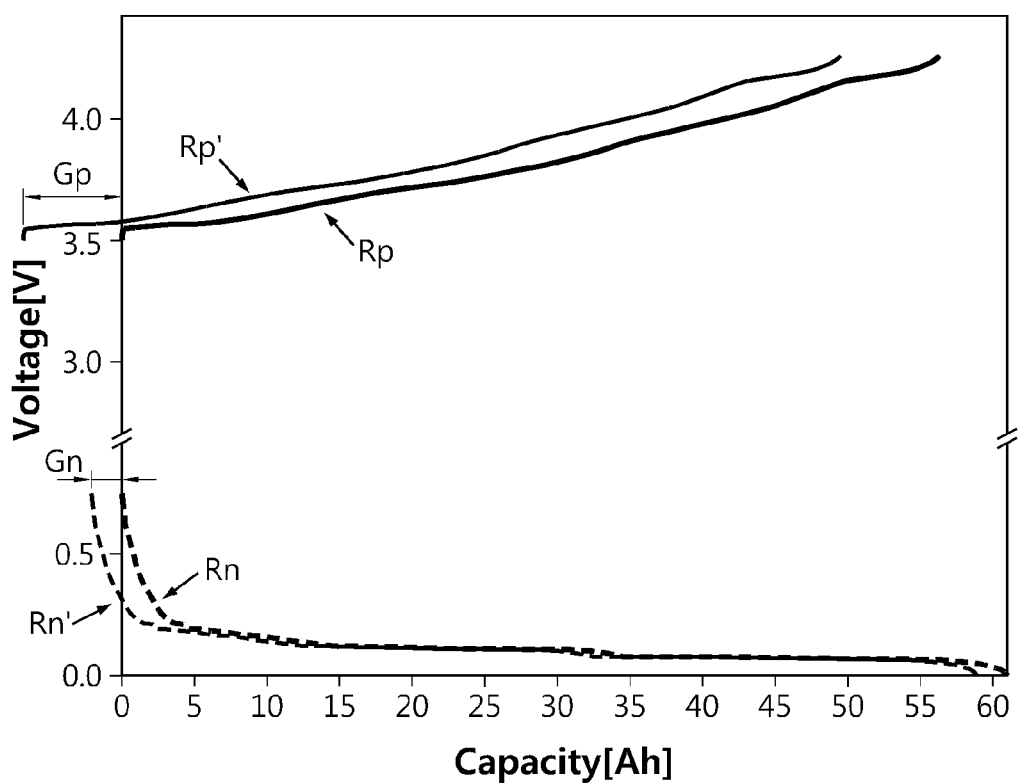
FIG. 10 is a graph comparatively showing the positive electrode reference profile and the negative electrode reference profile as well as the positive electrode adjustment profile and the negative electrode adjustment profile by the processor according to an embodiment of the present disclosure.

FIG. 10 is a graph comparatively showing the positive electrode reference profile and the negative electrode reference profile as well as the positive electrode adjustment profile and the negative electrode adjustment profile by the processor 300 according to an embodiment of the present disclosure.

Referring to FIG. 10, it may be regarded that the profile Rp represents a positive electrode reference profile stored in the memory unit 100 and the profile Rn represents a negative electrode reference profile stored in the memory unit 100. In addition, the profile Rp' may be regarded as a positive electrode adjustment profile obtained in the process of matching the simulation profile R to the charge and discharge measurement profile M as much as possible by the processor 300. In addition, profile Rn' may be regarded as a negative electrode adjustment profile obtained in the process of matching the simulation profile R to the charge and discharge measurement profile M as much as possible by the processor 300.

The processor 300 may identify the positive electrode nonuse area by checking how much the point where the capacity is 0 in the positive electrode reference profile Rp is moved in the capacity axis (–x axis) direction in the positive electrode adjustment profile Rp'. In addition, the processor 300 may identify the negative electrode nonuse area by checking how much the point where the capacity is 0 in the negative electrode reference profile Rn is moved in the capacity axis (-x axis) direction in the negative electrode adjustment profile Rn'.

More specifically, in FIG. 10, it may be confirmed that the point where the capacity is 0 in the positive electrode reference profile Rp is moved in the left direction (-x-axis direction) by Gp in the positive electrode adjustment profile Rp'. In this case, the processor 300 may judge that a positive electrode nonuse area is generated as much as Gp [Ah] in the target battery. In addition, it may be confirmed that the point where the capacity is 0 in the negative electrode reference profile Rn is moved to the left by Gn in the negative electrode adjustment profile Rn'. In this case, the processor 300 may judge that a negative electrode nonuse area is generated as much as Gn [Ah] in the target battery.

According to this configuration of the present disclosure, through comparison between the reference profile and the adjustment profile, the positive electrode nonuse area and the negative electrode nonuse area of the target battery may be identified simply and accurately. In addition, according to this embodiment, the use area of the target battery may be easily identified.

The processor 300 may be configured to reduce the error with the charge and discharge measurement profile M by moving the simulation profile R in parallel in the vertical direction. That is, even after adjustments such as movement and/or shrinkage are performed with respect to the positive electrode reference profile and/or the negative electrode reference profile so that the adjusted simulation profile R' has a small error with the charge and discharge measurement profile M as described above, the processor 300 may move the adjusted simulation profile R upward or downward in parallel to further reduce the error. That is, the processor 300 may perform a secondary adjusting process of moving the simulation profile, which is firstly adjusted through movement and/or scale adjusting of the reference profile, again in the vertical direction. This will be described in more detail with reference to FIG. 11.

Figure 11:
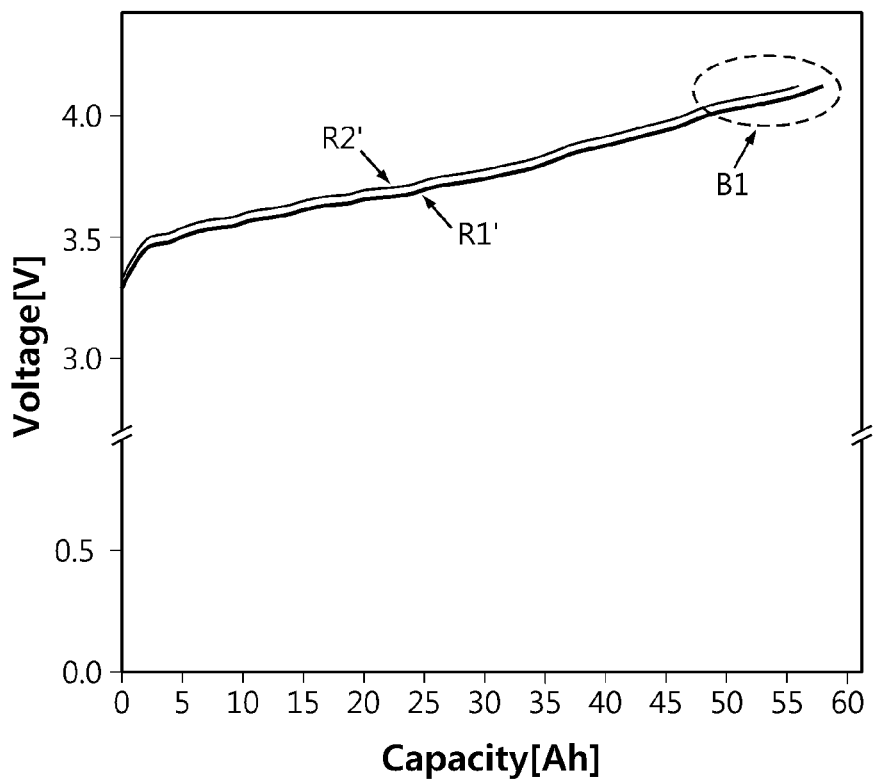
FIG. 11 is a graph schematically showing a configuration in which the simulation profile is moved in parallel in a vertical direction by the processor according to an embodiment of the present disclosure.

FIG. 11 is a graph schematically showing a configuration in which the simulation profile R is moved in parallel in a vertical direction by the processor according to an embodiment of the present disclosure.

Referring to FIG. 11, as described above, the simulation profile may be obtained primarily based on the positive electrode adjustment profile and the negative electrode adjustment profile. In addition, this is indicated by R1' in FIG. 11, and is called the simulation primary adjustment profile. The simulation primary adjustment profile R1' may be obtained from the positive electrode primary adjustment profile and the negative electrode primary adjustment profile obtained through movement in the horizontal direction, the scale adjusting (shrinkage), determination of pi, pf, ni, nf, and the like with respect to the positive electrode reference profile and/or the negative electrode reference profile as described above. More specifically, the simulation primary adjustment profile R1' may be a full-cell voltage profile obtained from the difference between the positive electrode primary adjustment profile and the negative electrode primary adjustment profile.

That is, the simulation primary adjustment profile R1' may be regarded as a value in which the error with the charge and discharge measurement profile M is minimized through adjustment of the positive electrode reference profile and/or the negative electrode reference profile. However, there may exist cases in which the error with the charge and discharge measurement profile M is further reduced through upward or downward movement (movement in the y-axis direction) of the simulation primary adjustment profile R1'. The processor 300 may be configured to search for a case where the error with the charge and discharge measurement profile M is reduced by moving the simulation primary adjustment profile R1' in the vertical direction in this way.

For example, the processor 300 may obtain a profile as indicated by R2' by moving the simulation primary adjustment profile R1' in parallel in the upper direction in the configuration of FIG. 11. If the error of the profile R2' with the charge and discharge measurement profile M is reduced compared to the profile R1', the processor 300 may call the profile R2' a secondarily adjusted simulation profile, namely a simulation secondary adjustment profile.

If the simulation secondary adjustment profile R2' in which the error with the charge and discharge measurement profile M is further reduced is searched for by moving the simulation primary adjustment profile R1' in parallel in the y-axis direction, the processor 300 may be configured to identify whether an internal resistance of the target battery is increased in consideration of the parallel movement result. That is, the processor 300 may identify an internal resistance change of the target battery based on how much the simulation secondary adjustment profile R2' moves upward from the simulation primary adjustment profile R1'. This will be described in more detail with reference to FIG. 12.

Figure 12:
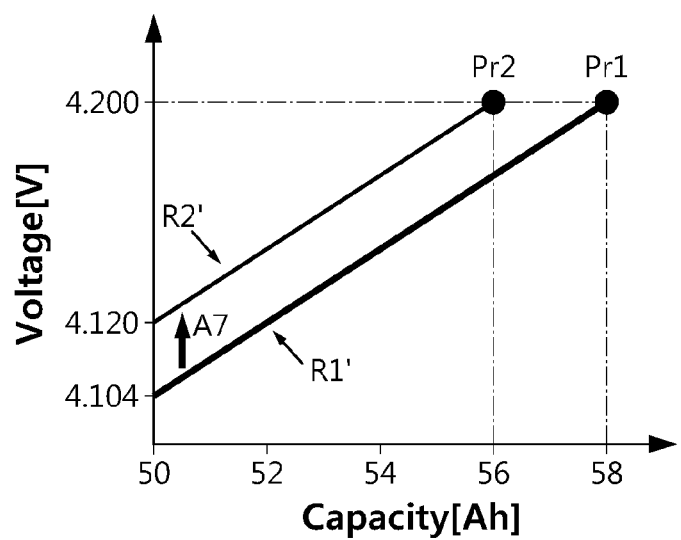
FIG. 12 is an enlarged graph showing a portion B1 of FIG. 11.

FIG. 12 is an enlarged graph showing a portion B1 of FIG. 11. However, for convenience of explanation, in FIG. 12, the capacity axis and the voltage axis corresponding to the portion B1 of FIG. 11 are displayed together.

Referring to FIG. 12, the simulation secondary adjustment profile R2' may be obtained by moving in parallel from the simulation primary adjustment profile R1' in the arrow A7 direction, namely in the upper direction. At this time, the degree of movement in the upper direction may be calculated as 4.120−4.104=0.016, and 0.016 [V] may be obtained. Therefore, it may be regarded that the processor 300 obtains the simulation secondary adjustment profile R2' by moving the simulation primary adjustment profile R1' upward by 0.016 V, namely by 16 mV.

In this case, the processor 300 may judge that 16 mV, which is the magnitude of the parallel movement in the upper direction, is the magnitude of the voltage increase due to the increase in the internal resistance of the target battery. That is, if the internal resistance of the secondary battery increases, it may cause an increase in overvoltage, and the processor 300 may identify how much the overvoltage of the target battery is increased through the parallel movement adjustment value of the simulation profile. That is, in this embodiment, the processor 300 may judge that the internal resistance is increased such that the overvoltage increases by 16 mV with respect to the target battery. In particular, when the simulation secondary adjustment profile R2' is obtained by moving the simulation primary adjustment profile R1' upward, the processor 300 may judge that the internal resistance of the target battery is increased. Meanwhile, if the simulation secondary adjustment profile R2' is obtained by moving the simulation primary adjustment profile R1' downward, the processor 300 may judge that the internal resistance of the target battery is decreased.

Moreover, the processor 300 may easily identify how much capacity is lost, when the voltage is increased due to the increase in internal resistance. In particular, the processor 300 may identify the capacity loss of the target battery through the capacity difference at the point where the simulation primary adjustment profile R1' and the simulation secondary adjustment profile R2' reach preset charge end voltage.

For example, in the embodiment of FIG. 12, when the charge end voltage of the target battery is 4.2 V, the processor 300 may search for a point where the charge end voltage becomes 4.2 V in the simulation primary adjustment profile R1' and the simulation secondary adjustment profile R2', respectively. In FIG. 12, such a point is denoted by Pr1 and Pr2, respectively. In addition, the processor 300 may confirm capacity values of these points Pr1 and Pr2, respectively. In FIG. 12, it may be confirmed that the capacity value of Pr1 is 58 Ah, and the capacity value of Pr2 is 56 Ah. In this case, the processor 300 may determine that 2 Ah, which is the difference between Pr1 and Pr2, is a capacity loss value according to the increase in internal resistance for the target battery.

If the capacity axis (x-axis) is expressed in a unit of % in the embodiment of FIG. 12, the processor 300 may directly extract the capacity loss value according to the increase in internal resistance in the unit of %. For example, if the x coordinate value of Pr1 is 94% and the x coordinate value of Pr2 is 93%, the processor 300 may calculate the capacity loss value according to the increase in the internal resistance of the target battery as 94−93=1, and thus judge that the capacity loss value is 1%. In addition, in this case, the processor 300 may predict that the target battery shuts down 1% earlier due to the increase in internal resistance.

According to this embodiment of the present disclosure, by adjusting the simulation profile, it may be easily judged whether or not the internal resistance of the target battery increases and how much the overvoltage increase or the capacity is lost.

The secondary battery diagnosing apparatus according to the present disclosure may be applied to a battery pack. That is, the battery pack according to the present disclosure may include the secondary battery diagnosing apparatus according to the present disclosure described above. In addition, the battery pack according to the present disclosure may further include components typically included in the battery pack, such as one or more secondary batteries, BMS (Battery Management System), current sensors, relays, fuses, a pack case and the like, in addition to the secondary battery diagnosing apparatus according to the present disclosure. In this case, the secondary battery included in the battery pack may be a target diagnosed by the secondary battery diagnosing apparatus according to the present disclosure, namely a target battery. In addition, at least some components of the secondary battery diagnosing apparatus according to the present disclosure may be implemented as conventional components included in the battery pack. For example, the voltage measuring unit 200 of the secondary battery diagnosing apparatus according to the present disclosure may be implemented using the voltage sensor included in the battery pack. In addition, at least some functions or operations of the processor 300 of the secondary battery diagnostic apparatus according to the present disclosure may be implemented by the BMS included in the battery pack.

In addition, the secondary battery diagnosing apparatus according to the present disclosure may be applied to a vehicle. That is, the vehicle according to the present disclosure may include the secondary battery diagnosing apparatus according to the present disclosure described above. In particular, in the case of an electric vehicle, the battery pack is a very important component as a driving source, so the secondary battery diagnosing apparatus according to the present disclosure may be more usefully applied. In addition, the vehicle according to the present disclosure may further include other various devices, such as a vehicle body, a vehicle control unit such as an electronic control unit (ECU), a motor, a connection terminal, a DC-DC converter, and the like, in addition to the secondary battery diagnosing apparatus. In addition, the vehicle according to the present disclosure may further employ components typically included in a vehicle.

Figure 13:
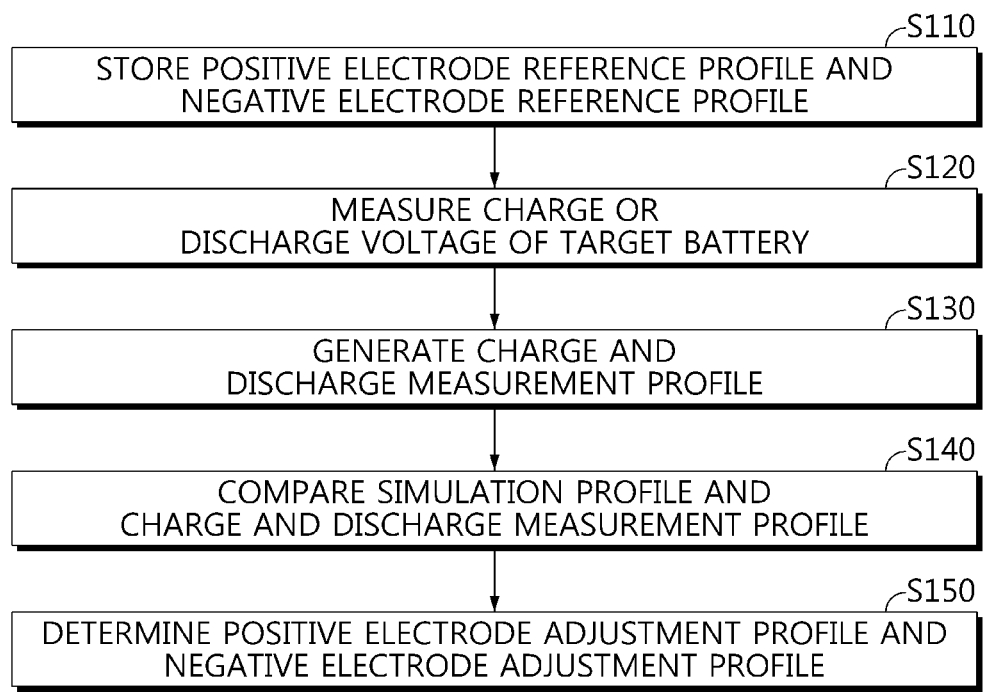
FIG. 13 is a flowchart schematically showing a secondary battery diagnosing method according to an embodiment of the present disclosure.

FIG. 13 is a flowchart schematically showing a secondary battery diagnosing method according to an embodiment of the present disclosure. In FIG. 13, each step may be performed by each component of the secondary battery diagnosing apparatus described above.

Referring to FIG. 13, the secondary battery diagnosing method according to the present disclosure includes a reference profile storing step (S110), a charge and discharge voltage measuring step (S120), a charge and discharge measurement profile generating step (S130), a simulation profile and charge and discharge measurement profile comparing step (S140); and a positive electrode adjustment profile and negative electrode adjustment profile determining step (S150).

The step S110 is a step of storing a positive electrode reference profile and a negative electrode reference profile for charge or discharge of a reference battery.

The step S120 is a step of measuring a voltage while charging or discharging the target battery.

The step S130 is a step of generating a charge and discharge measurement profile M based on the voltage measured in the step S120.

The step S140 is a step of comparing a simulation profile obtained from the positive electrode reference profile and the negative electrode reference profile stored in the step S110 with the charge and discharge measurement profile generated in the step S130.

In the step S150 is a step of determining a positive electrode adjustment profile and a negative electrode adjustment profile so that an error between the simulation profile and the charge and discharge measurement profile is within a certain level, when it is judged that an error of the certain level or above exists between the simulation profile and the charge and discharge measurement profile through the comparison in the S140 step.

For these steps S110 to S150, the features of the secondary battery diagnosing apparatus according to the present disclosure described above may be applied identically or similarly. Therefore, each step of the secondary battery diagnosing method according to the present disclosure will not be described in detail here.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

100: memory unit
200: voltage measuring unit
300: processor
Rp: positive electrode reference profile
Rn: negative electrode reference profile
Rp': positive electrode adjustment profile
Rn': negative electrode adjustment profile

What is claimed is:

1. A secondary battery diagnosing apparatus, comprising:
memory configured to store a positive electrode reference profile and a negative electrode reference profile for charge or discharge of a reference battery;
a voltage sensor configured to measure a voltage of a target battery during a charge or discharge process; and
a processor configured to:
generate a charge and discharge measurement profile based on the measured voltage;
compare a simulation profile obtained from the positive electrode reference profile and the negative electrode reference profile with the generated charge and discharge measurement profile;
determine a positive electrode adjustment profile and a negative electrode adjustment profile by adjusting an error between the simulation profile and the charge and discharge measurement profile to within a predetermined level; and
diagnose the target battery for defect based on the determined positive electrode adjustment profile and the determined negative electrode adjustment profile.

2. The secondary battery diagnosing apparatus according to claim 1, wherein each of the positive electrode reference profile and the negative electrode reference profile includes a first axis representing a capacity of the battery and a second axis representing the voltage of the battery.

3. The secondary battery diagnosing apparatus according to claim 2, wherein the processor is configured to determine the positive electrode adjustment profile and the negative electrode adjustment profile by adjusting a scale of at least one of the positive electrode reference profile and the negative electrode reference profile along the first axis.

4. The secondary battery diagnosing apparatus according to claim 1, wherein the voltage sensor is configured to measure a full discharge voltage and a full charge voltage of the target battery, and the processor is configured to:
estimate a positive electrode starting value of the positive electrode adjustment profile or a negative electrode starting value of the negative electrode adjustment profile based on the full discharge voltage, and
estimate a positive electrode final value of the positive electrode adjustment profile and a negative electrode final value of the negative electrode adjustment profile based on the full charge voltage.

5. The secondary battery diagnosing apparatus according to claim 4, wherein the processor is configured to identify a capacity of the target battery based on a difference between the positive electrode final value and the positive electrode starting value or a difference between the negative electrode final value and the negative electrode starting value.

6. The secondary battery diagnosing apparatus according to claim 1, wherein the processor is configured to identify a positive electrode nonuse area and a negative electrode nonuse area of the target battery based on the positive electrode adjustment profile and the negative electrode adjustment profile, respectively.

7. The secondary battery diagnosing apparatus according to claim 2, wherein, in response to the error between the simulation profile and the charge and discharge measurement profile being reduced by moving the simulation profile in a direction of the second axis, the processor is configured to determine whether the movement of the simulation profile causes an internal resistance of the target battery to increase.

8. A battery pack, comprising the secondary battery diagnosing apparatus according to claim 1.

9. A vehicle, comprising the secondary battery diagnosing apparatus according to claim 1.

10. A secondary battery diagnosing method, comprising:
storing, at memory, a positive electrode reference profile and a negative electrode reference profile for charge or discharge of a reference battery;
measuring, by a voltage sensor, a voltage of a target battery while charging or discharging the target battery;
generating, by a processor, a charge and discharge measurement profile based on the measured voltage;
comparing, by the processor, a simulation profile obtained from the positive electrode reference profile and the negative electrode reference profile stored with the charge and discharge measurement profile;
determining, by the processor, a positive electrode adjustment profile and a negative electrode adjustment profile by adjusting an error between the simulation profile and the charge and discharge measurement profile to within a predetermined level; and
diagnosing, by the processor, the target battery for defect based on the determined positive electrode adjustment profile and the determined negative electrode adjustment profile.

11. The secondary battery diagnosing apparatus according to claim 2, wherein the processor is configured to determine the positive electrode adjustment profile and the negative electrode adjustment profile by moving at least one of the positive electrode reference profile and the negative electrode reference profile in a direction of the first axis.

* * * * *